(12) United States Patent
Nichols

(10) Patent No.: US 8,458,560 B2
(45) Date of Patent: Jun. 4, 2013

(54) SYSTEMS AND METHODS FOR EFFICIENT PARALLEL IMPLEMENTATION OF BURST ERROR CORRECTION CODES

(75) Inventor: Jeffery T. Nichols, Marietta, GA (US)

(73) Assignee: Ciena Corporation, Hanover, MD (US)

(*) Notice: Subject to any disclaimer, the term of this patent is extended or adjusted under 35 U.S.C. 154(b) by 1302 days.

(21) Appl. No.: 12/017,629

(22) Filed: Jan. 22, 2008

(65) Prior Publication Data
US 2009/0187808 A1 Jul. 23, 2009

(51) Int. Cl.
*H03M 13/00* (2006.01)

(52) U.S. Cl.
USPC .......................................................... 714/762

(58) Field of Classification Search
USPC .................................. 714/755, 762, 784
See application file for complete search history.

(56) References Cited

U.S. PATENT DOCUMENTS

| 4,782,490 A * | 11/1988 | Tenengolts ...................... 714/756 |
| 5,491,701 A * | 2/1996 | Zook .............................. 714/762 |
| 2010/0031120 A1* | 2/2010 | Belogolovy et al. .......... 714/762 |

* cited by examiner

*Primary Examiner* — James C Kerveros
(74) *Attorney, Agent, or Firm* — Clements Bernard PLLC; Christopher L. Bernard; Lawrence A. Baratta, Jr.

(57) ABSTRACT

The present invention provides systems and methods for an efficient, parallel implementation of burst error correction codes, such as the Fire code. The present invention includes a FEC decoder which is pipelined to simultaneously perform syndrome computation, error trapping and syndrome normalization, and error correction. The pipelined implementation can apply to shortened and full-length codes. Advantageously, the present invention yields a design which is approximately $\frac{1}{20}^{th}$ the size of conventional parallel approaches.

18 Claims, 3 Drawing Sheets

SYSTEMS AND METHODS FOR EFFICIENT PARALLEL IMPLEMENTATION OF BURST ERROR CORRECTION CODES

FIELD OF THE INVENTION

The present invention relates generally to communications, and more particularly, to systems and methods for an efficient, parallel implementation of burst forward error correction (FEC) codes.

BACKGROUND OF THE INVENTION

The Fire Code is created by multiplying two polynomials; an irreducible polynomial of degree m, and a second polynomial $X^{21-1}+1$. Newer protocols devised for high-speed serializer/deserializers (SERDES) make use of burst error correction codes, such as the Fire code, to correct burst errors. The Institute of Electrical and Electronics Engineers (IEEE) 802.3ap standard calls for a shortened 32-bit Fire code capable of correcting bursts of up to 11-bits and the Optical Internetworking Forum's (OIF) Common Electrical Interface for 6 Gbps SerDes calls for a 24-bit Fire code capable of correcting bursts of up to 7-bits. The 802.3ap Fire code is usually described as a (2112,2080) Fire Code which is a shortened version of the (42987,42955) code. The OIF CEI-P code is a (1584,1564) Fire code which is shortened from the (1651,1631) Fire code. The number of parity bits in the OIF code is actually 20-bits. These designs use a parallel implementation of the Meggitt Error Trapping Decoder.

A classic Error Trapping Decoder, for burst error correcting codes, works by using the entire generator polynomial of an (n,k) code and cyclic shifting through up to n values until the error is trapped in the syndrome register. The error is trapped when the shift register contains zeros in all registers except for a contiguous group of up to m registers, where m is the burst error correcting capability of the code. The number of shifts defines the location of the error and the group of m registers defines the error value.

Implementations of the OIF-CEI-P and 10 GBASE-KR use a parallel implementation of the Meggitt Error Trapping Decoder in Field Programmable Gate Arrays (FPGAs), Application Specific Integrated Circuits (ASICs), or full-custom integrated circuits. The Fire code, used in the 10 GBASE-KR standard, has an implementation complexity of approximately 14,000 gates. By today's standards, this may not sound like a large design but many implementations may use 100 or more instances of the decoder and the total implementation complexity could require over 1.4 million gates. The increased gate count adds to the cost and power of the integrated circuit.

BRIEF SUMMARY OF THE INVENTION

In various exemplary embodiments, the present invention provides systems and methods for an efficient, parallel implementation of burst error correction codes, such as the Fire code. The present invention includes a FEC decoder which is pipelined to simultaneously perform syndrome computation, error trapping and syndrome normalization, and error correction. The pipelined implementation can apply to shortened and full-length codes. Advantageously, the present invention yields a design which is approximately $\frac{1}{20}^{th}$ the size of conventional parallel approaches.

In an exemplary embodiment of the present invention, a system for the efficient parallel implementation of a burst error correction code includes error trapping circuitry configured to find an error pattern and a starting location of an error burst within a data word of a plurality of data words including a full code word; error location circuitry configured to find which data word of the plurality of data words holds the starting location of the error burst, wherein the error location circuitry includes circuitry configured to perform Galois Field arithmetic to align a starting location of the error burst based on the error trapping circuitry; and error correction circuitry configured to correct the error burst. The error trapping circuitry includes circuitry configured to calculate a first syndrome over each of the plurality of data words, wherein the first syndrome is utilized to trap the error pattern; wherein the error location circuitry includes circuitry configured to calculate a second syndrome over each of the plurality of data words, wherein the second syndrome is utilized to determine which of the plurality of data words include a beginning of the error pattern, and wherein the circuitry configured to perform Galois Field arithmetic operates on the second syndrome. Optionally, the error trapping circuitry further includes a shift register configured to shift until the error burst is trapped; and the circuitry configured to perform Galois Field arithmetic is further configured to align the second syndrome responsive to the number of shifts of the shift register.

The system can further include comparison circuitry to check the second syndrome after the Galois Field arithmetic with the error burst; and second circuitry configured to perform Galois Field arithmetic to align the second syndrome to a another data word of the plurality of data words if the comparison circuitry is not equal; wherein the error correction circuitry configured to correct the error burst if the comparison circuitry is equal. If the comparison circuitry is not equal, a current data word of the plurality of data words does not contain the error pattern, and wherein the current data word is output for processing. Optionally, the error correction circuitry includes an exclusive OR. The burst error correction code includes a generator polynomial in a form $g(X)=(X^{21-n}+1)p(X)$ and all of the Galois field arithmetic is performed in $GF(2^m)$, where m is the order of the primitive polynomial p(X) and n is a positive integer such that n<=m and 21−n is not divisible by a period of p(X). Optionally, the burst error correction code includes a (2112, 2080) burst error correction code and the generator polynomial is in a form $g(X)=(X^{21}+1)(X^{11}+X^2+1)$ and all of the Galois field arithmetic is performed in $GF(2^{11})$. The error trapping circuitry, the error location circuitry, and the error correction circuitry are pipelined to simultaneously perform Syndrome Computation, Error Trapping and Syndrome Normalization, and Error Correction. The system can further include a Delay random access memory configured to store the plurality of data words while the Syndrome Computation and Error Trapping functions are processing in the error trapping circuitry and the error location circuitry. The Syndrome Computation requires 101 cycles for the (2112, 2080) burst error correction code; the Error Trapping and Syndrome Normalization function requires 20 cycles for the (2112, 2080) burst error correction code; and the error correction circuitry processes values coming out of the Delay random access memory without requiring additional cycles. Optionally, the system is compliant to IEEE 802.3ap.

In another exemplary embodiment of the present invention, a method for the efficient parallel implementation of a burst error correction code includes partitioning a received block of data into a plurality of data words; calculating a first syndrome and a second syndrome using each of the plurality of data words; trapping an error burst utilizing the first syndrome; determining which of the plurality of data words contains the error burst based on the second syndrome; aligning the second syndrome with Galois Field arithmetic; and checking the trapped error burst with the aligned second syndrome. The method can further include, if the checking step determines the trapped error burst equals the aligned second syndrome, correcting the error burst utilizing the trapped error burst and the aligned second syndrome; and, if the checking step determines the trapped error burst does not equals the aligned second syndrome, aligning the second syndrome with Galois Field arithmetic to a next data word of the plurality of data words and providing a current data word for processing. The burst error correction code includes a generator polynomial in a form $g(X)=(X^{21-n}+1)p(X)$ and all of the Galois field arithmetic is performed in $GF(2^m)$, where m is the order of the primitive polynomial $p(X)$ and n is a positive integer such that n<=m and 21−n is not divisible by a period of $p(X)$. Optionally, the burst error correction code includes a (2112, 2080) burst error correction code and the generator polynomial is in a form $g(X)=(X^{21}+1)(X^{11}+X^2+1)$ and all of the Galois field arithmetic is performed in $GF(2^{11})$. Alternatively, the method is utilized in a device compliant to IEEE 802.3ap.

In yet another exemplary embodiment of the present invention, a Fire Code FEC decoder for a (2112, 2080) code includes circuitry configured to zero-pad a 2112-bit block and to provide 101 21-bit data words; a parallel implementation of $S_p(X)=r(X)$ modulo $X^{21}+1$ with the 101 21-bit data words; a parallel implementation of $S_m(X)=r(X)$ modulo $X^{11}+X^2+1$ with the 101 21-bit data words; a first-in-first-out buffer loaded with each of the 101 21-bit data words; a 21-bit shift register configured to trap an error burst based on an output from the parallel implementation of $S_p(X)$; a counter configured to track a number of shifts required by the 21-bit shift register to trap the error burst; a normalization multiplier of $\alpha^{1973}$ circuitry configured to multiply an output of the parallel implementation of $S_m(X)$; a normalization multiplier of $\alpha^1$ circuitry configured to multiply the output of the normalization multiplier of $\alpha^{1973}$ multiplied by the output of the parallel implementation of $S_m(X)$, wherein the normalization multiplier of $\alpha^1$ is multiplied responsive to the number of shifts; and comparison circuitry configured to compare an output of the normalization multiplier of $\alpha^1$ circuitry with the trapped error burst, wherein if the outputs do not match, the output of the normalization multiplier of $\alpha^1$ is multiplied through normalization multiplier of $\alpha^{21}$ circuitry, and wherein if the outputs do match, the trapped error burst is corrected. Optionally, the FEC decoder is utilized in a device compliant IEEE 802.3ap. Alternatively, the FEC decoder includes an application specific integrated circuit, wherein the application specific integrated circuit includes significantly less gates than a conventional error trapping decoder.

BRIEF DESCRIPTION OF THE DRAWINGS

The present invention is illustrated and described herein with reference to the various drawings, in which like reference numbers denote like method steps and/or system components, respectively, and in which.

DETAILED DESCRIPTION OF THE INVENTION

Figure 1:
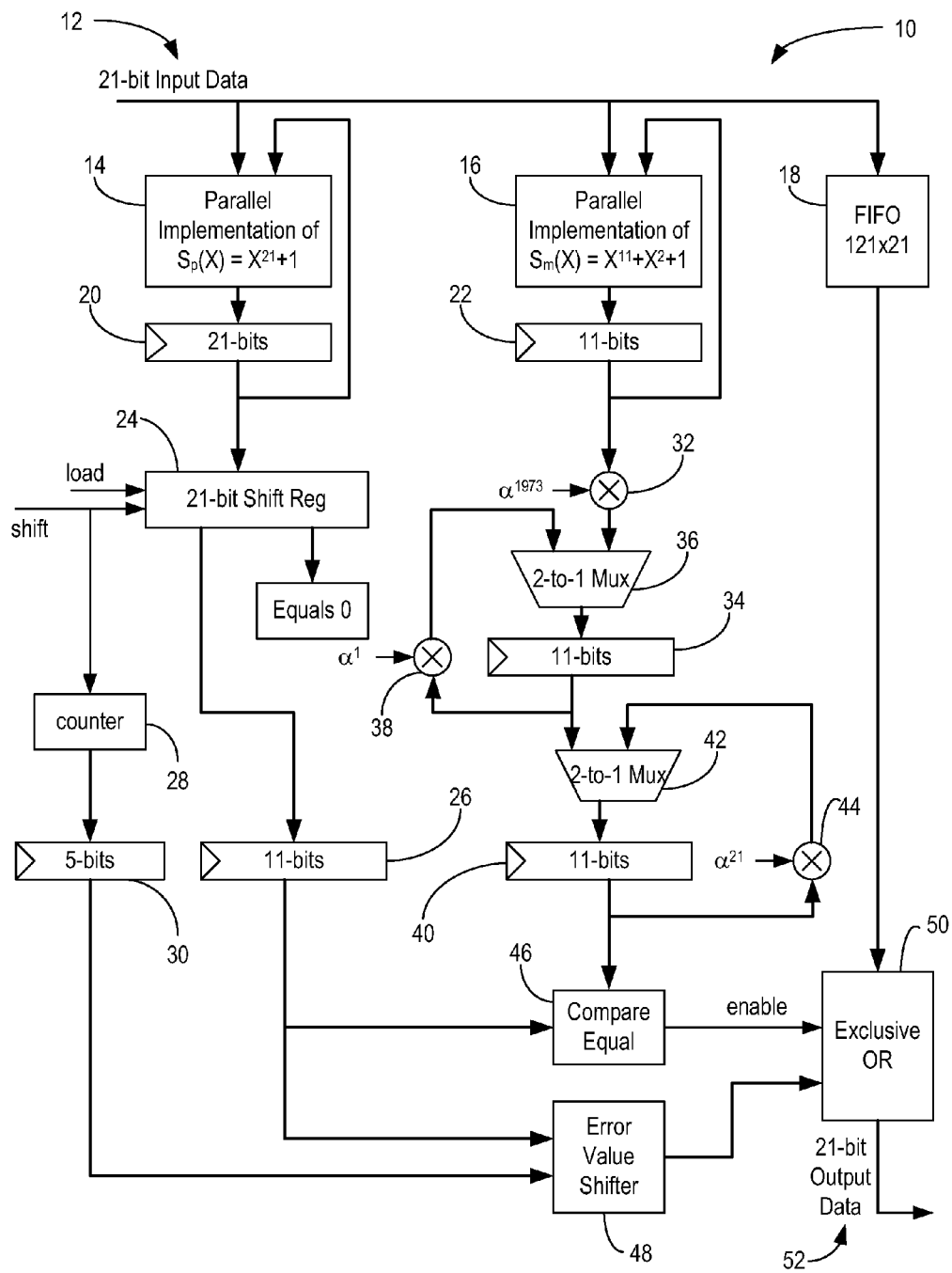
FIG. 1 is a functional block diagram of a FEC decoder configured to decode a (2112, 2080) burst error correction code according to an exemplary embodiment of the present invention.

In various exemplary embodiments, the present invention provides systems and methods for an efficient, parallel implementation of burst error correction codes, such as the Fire code. The present invention includes a FEC decoder which is pipelined to simultaneously perform syndrome computation, error trapping and syndrome normalization, and error correction. The pipelined implementation can apply to shortened and full-length codes. Advantageously, the present invention yields a design which is approximately $\frac{1}{20}^{th}$ the size of conventional parallel approaches.

The present invention is illustrated with regards to a shortened Fire code with a generator polynomial of $(X^{21}+1)(X^{11}+X^2+1)=X^{32}+X^{23}+X^{21}+X^{11}+X^2+1$. Note, this is the code specified in IEEE 802.3ap, i.e. a (2112, 2080) burst error correction code which is a shortened cyclic code with 32 redundant bits. The full length code is 42,987-bits, but it has been shortened to 2112-bits. The order of the first polynomial $(X^{21}+1)$ is 21-bits and the first polynomial defines the data width of the FEC decoder. Those of ordinary skill in the art will recognize that the systems and methods present herein can work for other Fire code polynomials as well. Also, someone skilled in the art will recognize that the systems and methods present could be easily expanded to 42 bits or any width i*21. Furthermore, with a little extra hardware the methods can support non-integer multiples of the defined data width.

In a more general case, the generator polynomial is of the form $g(X)=(X^{21-l}+1) p(X)$; where $p(X)$ is a primitive polynomial of degree m and l is a positive integer such that $1<=m$ and 21-l is not divisible by the period of $p(X)$. The Fire Code in the present invention requires that the second polynomial is irreducible. The pipelined implementation of the present invention has the additional requirement that the second polynomial term is primitive and forms a Galois Field in $GF(2^{11})$. In the general case, this is $GF(2^m)$, where m is the order of $p(X)$.

The present invention provides a simplified FEC decoder implementation. In an exemplary embodiment, the FEC decoder is configured to receive an encoded signal consisting of 32×65 bit payload blocks which are encoded by a FEC encoder for a (2112,2080) code. This code is linear quasi-cyclic code that can be encoded by generator polynomial $g(x)$. 32 parity bits are appended to data bits and scrambled before transmission.

The generator polynomial $g(x)$ for the (2112, 2080) parity-check bits is defined as $g(x)=X^{32}+X^{23}+X^{21}+X^{11}+X^2+1$ then, if the polynomial representation of information bits is $m(x)$, the codeword $c(x)$ can be calculated in systematic form as:

$r(x)=X^{32}m(x)$ modulo $g(x)$ $c(x)=r(x)+X^{32}m(x)$

PN-2112 is a pseudo-noise sequence of length 2112 generated by the polynomial $r(x)$ that is equal to the scrambler polynomial with initial state $S_{57}=1$, $S_{i-1}=S_i$ XOR 1 or simply the binary sequence of 101010 . . . . Before each codeword processing (encoding or decoding) the PN-2112 generator is initialized with this state of 101010 . . . . The scrambling with PN-2112 sequence at the FEC codeword boundary is necessary for establishing FEC block synchronization (to ensure that any shifted input bit sequence will not be equal to another FEC codeword) and to ensure DC balance.

The Fire Code Syndrome values, $S_p(X)$ and $S_m(X)$, are the remainders resulting from dividing the received codeword, r(X), by $X^{21}+1$ and $X^{11}+X^2+1$, respectively.

$$S_p(X)=r(X) \text{ modulo } X^{21}+1; \text{ and}$$

$$S_m(X)=r(X) \text{ modulo } X^{11}+X^2+1.$$

One syndrome is used to determine an error pattern and the second polynomial is used to find error locations. If the FEC block does not contain any errors, then the remainder from the division by both polynomials must return a value of zero. If one syndrome value is zero and the other is non-zero, then the FEC block contains uncorrectable errors. If both syndrome values contain non-zero values, error correction can be accomplished based on the logic described herein. There are three conditions where the error may not be correctable: (1) one of the two syndrome values is zero and the other is non-zero; (2) the shift-register fails to trap the error pattern; and, (3) the comparison of the trapped error value fails to match the value in an error location register when the end of the codeword is reached. If the code is not shortened (i.e., full length), then item number (3) never happens.

Referring to FIG. 1, a block diagram illustrates a FEC decoder 10 configured to decode a (2112, 2080) burst error correction code according to an exemplary embodiment of the present invention. First, with regard to the (2112, 2080) code, the input data to the decoder 10 is zero padded to form a 2121-bit data from a 2112-bit Fire Code block for ease of processing. This does not affect the decoder 10 except the normalization multiplier is scaled by nine to compensate for the zero-pad. Also, the shift value is adjusted compensate for the shifting of the codeword when the zeros are added. A full length codeword and a codeword shortened to any multiple of 21 do not need the zero-pad bits and adjustment to the normalization multiplier.

The FEC decoder 10 is configured to receive a 21-bit input data stream 12. For example, the input data stream 12 can be formed by a SERDES macro that can recover a serial bitstream of data and parallelize the data into a 20-bit datapath with a 312.5 MHz clock. The data can be synchronized to the 375 MHz core clock domain via a small trans-domain first-in-first-out (FIFO). To simplify the Fire Code FEC decoder 10 and PN-2112 descrambler, the data is zero-padded with 9-zeros and translated into a 21-bit data path. The FEC block is now a block of 101 21-bit words. For example, the zero-padded 101-word FEC block is shown in the following table with the bits numbered by order of transmission from 0 to 2111.

| Word | 21-bit Data | |
| --- | --- | --- |
| 0 | 9-bit zero pad | d[0:11] |
| 1 | d[12:32] | |
| 2 | d[33:53] | |
| 3 | d[54:74] | |
| 4 | d[75:95] | |
| 5 | d[96:116] | |
| 6 | d[117:137] | |
| 7 | d[138:158] | |
| ... | ... | |
| ... | ... | |
| ... | ... | |

-continued

| Word | 21-bit Data |
| --- | --- |
| 98 | d[2049:2069] |
| 99 | d[2070:2090] |
| 100 | d[2091:2111] |

Zero-padding the input data with nine zeros, makes the 2112-bit Fire Code block size equal 2121 bits or 101 21-bit words. Zeros at the beginning of the code do not affect the parity bits but it does remove any requirement to "normalize" the syndrome value by circularly rotating $S_p$ by a fixed value.

The syndrome value $S_p$ is used to trap the error value and find the error location modulo 21. The syndrome value $S_m$ is used to find the 21-bit word where the first bit error of the 11-bit burst occurs. If the block contains no errors, both syndrome values will be zero. If one syndrome value is zero and the other syndrome value is non-zero, the FEC block contains errors but is not correctable. If both syndrome values are non-zero, the FEC block may or may not be correctable and the decoder will discover the error location and pattern if correctable.

The FEC decoder 10 utilizes the input data stream 12 for a parallel implementation of $S_p(X)$ 14, a parallel implementation of $S_m(X)$ 16, and for loading into a FIFO 18. The syndrome computation includes the parallel implementation of the polynomials $S_p$ and $S_m$ 14,16 and the storage of the resulting 21-bit and 11-bit partial syndrome value in syndrome $S_p$ register 20 and $S_m$ register 22. The parallel implementation of the polynomials $S_p$ and $S_m$ 14,16 is performed over all 101 21-bit words of the 2112-bit Fire Code. In the first cycle, feedback of the partial syndrome value into the parallel syndrome computation blocks 14,16 is set to zero. The parallel implementation of $S_p(X)$ 14 is configured to compute the 21-bit error trapping syndrome with the polynomial $S_p(X)=r(X) \text{ modulo } X^{21}+1$. The parallel implementation of $S_p(X)$ 14 is configured to compute the equation 21-bits at a time using feedback from the syndrome $S_p$ register 20. After the parallel implementation 14 over all 101 21-bit words, the value in the $S_p$ register 20 is loaded into a 21-bit shift register 24. The 21-bit shift register 24 is also known as an error pattern register. Computation of either syndrome can be computed with a Linear Feedback Shift Register. However, the present invention needs to compute the result 21-bits at a time. Therefore, a parallel version of a Linear Feedback Shift Register is utilized.

After computing the syndrome value $S_p$ over the 2121 bit FEC block, the resulting syndrome value is loaded into the 21-bit shift register 20. If the syndrome value $S_p$ is zero, either the block cannot be corrected or the block does not contain any errors. Otherwise, the shift register 20 is used to trap the error value in bits $b_0$ through $b_{10}$. The 21-bit shift register 24 with $S_p$ is used to trap the error value in an error value register 26 and find the relative location of the error within a 21-bit window. The 21-bit shift register 24 is also known as an error pattern register or an error trapping register. The binary polynomial $S_p$ is used to trap the error value and find the bit location of the last bit of the error burst. The 21-bit shift register 24 is configured to continue to shift until an upper 10 bits are all zero, trapping the error in the least significant bits of the 21-bit shift register 24.

The shift register 20 is circularly rotated until bits $b_{11}$ through $b_{20}$ are all zeros. If after checking all 21 shift values (0 through 20) the error has not been trapped, the block is uncorrectable. The error value register 26 is loaded from the 21-bit shift register 24 with the error pattern from the 21-bit shift register 24. For each shift in the 21-bit shift register 24, a counter 28 is configured to increment. When the error is trapped in the least significant bits of the 21-bit shift register 24 and when the error value register 26 is loaded, the value of the counter 28 is loaded into a shift value register 30. The value in the shift value register 30 contains the error location within the 21-bit block.

The syndrome value $S_m$ is used to find the 21-bit word where the last error of the 11-bit burst occurred. The parallel implementation of $S_m(X)$ 16 is configured to compute the 11-bit error location syndrome with the polynomial $S_m(X)=r(x)$ modulo $X^{11}+X^2+1$. The parallel implementation of $S_m(X)$ 16 computes the equation 21-bits at a time using feedback from the syndrome $S_m$ register 22. On the first cycle, the feedback is set to all 0's.

The 11-bit syndrome value $S_m$ can be computed by shifting all 2112 bits of the FEC codeword into a Linear Feedback Shift Register, one bit at a time. The value in the shift register when all 2112-bits have been shifted in is the syndrome $S_m$. Given the previous state of the shift register and 21 new bits, the exclusive-or (XOR) terms shown produce the same state in the shift register as would be generated if each bit is shifted in one at a time. This allows computation of the syndrome in 101 clock cycles rather than 2112 clock cycles. This is done in parallel with the error trapping with the shift register 20.

In an exemplary embodiment, the parallel implementation of $S_m(X)$ 16 is computed by initially setting all values in syndrome $S_m$ register 22 to 0. The parallel implementation of $S_m(X)$ 16 utilizes a calculation for each of the 101 FEC code words, taking each of the code words 21-bits at a time and utilizing the existing state of the syndrome $S_m$ register 22 for the calculation. The updated syndrome $S_m$ register 22 is calculated based on multiple XOR's between bits from the code word and existing $S_m$ register 22 entries. These include:

$S_m[0]=S_{m-1}[1]$ XOR $S_{m-1}[8]$ XOR data[0] XOR data[9];

$S_m[1]=S_{m-1}[0]$ XOR $S_{m-1}[2]$ XOR $S_{m-1}[9]$ XOR data[1];

$S_m[2]=S_{m-1}[3]$ XOR $S_{m-1}[8]$ XOR $S_{m-1}[10]$ XOR data[0] XOR data[2] XOR data[9];

$S_m[3]=S_{m-1}[0]$ XOR $S_{m-1}[4]$ XOR $S_{m-1}[9]$ XOR data[1] XOR data[3];

$S_m[4]=S_{m-1}[1]$ XOR $S_{m-1}[5]$ XOR $S_{m-1}[10]$ XOR data[2] XOR data[4];

$S_m[5]=S_{m-1}[2]$ XOR $S_{m-1}[6]$ XOR data[3] XOR data[5];

$S_m[6]=S_{m-1}[3]$ XOR $S_{m-1}[7]$ XOR data[4] XOR data[6];

$S_m[7]=S_{m-1}[4]$ XOR $S_{m-1}[8]$ XOR data[5] XOR data[7];

$S_m[8]=S_{m-1}[5]$ XOR $S_{m-1}[9]$ XOR data[6] XOR data[8];

$S_m[9]=S_{m-1}[6]$ XOR $S_{m-1}[10]$ XOR data[7] XOR data[9];

$S_m[10]=S_{m-1}[0]$ XOR $S_{m-1}[7]$ XOR data[8];

where XOR is an exclusive OR operation, data[n] corresponds to bit n of the code word, $S_{m-1}[n]$ corresponds to the current syndrome $S_m$ register 22 entry for the nth bit, and $S_m[n]$ corresponds to the updated syndrome $S_m$ register 22 entry for the nth bit. As described herein, these calculations can be performed by the Linear Feedback Shift Register in 101 clock cycles for all 101 code words.

After the syndrome $S_m$ is computed for all 21-bit words and stored in the syndrome $S_m$ register 22, the value must be normalized to the beginning of the FEC block by multiplying by a normalization multiplier $\alpha^{1973}$ 32. The result of this multiplication is loaded into a normalized syndrome register 34 through a 2-to-1 multiplexer 36. Each time the error trapping shift register 24 is rotated, the syndrome is multiplied by a normalization multiplier $\alpha^1$ 38 to align an error location syndrome value in the normalized syndrome register 34 with the appropriate bit position. If the error trapping shift register 24 is rotated n times, then the syndrome is multiplied by the normalization multiplier $\alpha^1$ 34 n-times and is effectively multiplied by $\alpha^n$. The 2-to-1 multiplex 36 is utilized to determine which value is loaded into the normalized syndrome register 34, i.e. either the result of the multiplication with the normalization multiplier $\alpha^{1973}$ 32 or the result of the multiplication with the normalization multiplier $\alpha^1$ 38.

After completing the multiplication with the normalization multiplier $\alpha^{1973}$ 32 and the multiplication with the normalization multiplier $\alpha^1$ 38 n-times, this value from the normalized syndrome register 34 is then loaded into an error location register 40 through a 2-to-1 multiplexer 42.

As soon as the error has been trapped and the error location register 40 has been normalized, the 21-bit data can begin to be read from the FIFO 18. As the data is being read out of the FIFO 18, the value in the error value register 26 is compared 46 to the value in the error location register 40. If the two values are equal, then the error location has been found. Accordingly, the error value register 26 is shifted by an error value shifter 48 based on the error location in the shift value register 30. An Exclusive OR (XOR) 50 is enabled when the two values are equal, and the shifted error value is XOR'd with the output from the FIFO 18 to provide a corrected 21-bit output data word 52. Each cycle the error value register 26 is compared to the error location register 40. When a match occurs, the error is corrected.

If the shift value the shift value register 30 in is greater than 10, the 11-bit burst error pattern may span two 21-bit words. Therefore, when the error word location has been detected the 11-bit value partially corrects the current word and applies the remainder of the error value register 26 to the next word.

If the values in the error value register 26 and in the error location register 40 are not equal, the value in the error location register 40 is multiplied by a normalization multiplier $\alpha^{21}$ 44, an element in the field $GF(2^{11})$, and the error location register 38 is updated. The 2-to-1 multiplexer 42 is configured to load either the normalized syndrome register 34 or the result of the multiplication with the normalization multiplier $\alpha^{21}$ 44 in the error location register 40. The foregoing process is continued until the entire Fire code block is read out of the FIFO 18.

The present invention does not use the classic error trapping techniques. The error pattern register (21-bit shift register 24) finds the error pattern and the starting location of the error burst within a 21-bit word but does not define the actual error location. The error location register 40 finds which 21-bit word holds the starting location of the error burst. The present invention then utilizes Galois Field arithmetic, in $GF(2^{11})$, to align with the starting bit offset of the of the error location by multiplying by $\alpha$ for each cyclic shift of the shift register. Then, the present invention multiplies by $\alpha^{21}$ to cause the value in the error location register 40 to jump by 21-bits to the next possible error location. This allows the present invention to only apply the location test to the possible locations where an error may be found. Also, as soon as the test fails for a given location, the FEC decoders knows the error is not contained in this 21-bit word and it can be read out of a Delay RAM or the like and passed on for processing. This minimizes the data delay caused by FEC processing.

The FEC decoder 10 requires three constant coefficient multipliers in the Galois Field $GF(2^{11})$, i.e. normalization multiplier $\alpha^1$ 38, normalization multiplier $\alpha^{1973}$ 32, and normalization multiplier $\alpha^{21}$ 44. Multiplying by $\alpha^n$ corresponds to n shifts of a linear feedback shift register formed by the generator polynomial $g(x)=X^{11}+X^2+1$. Advantageously, constant coefficient multipliers in these binary-extension fields can be efficiently implemented using a small number of XOR gates.

Figure 2:
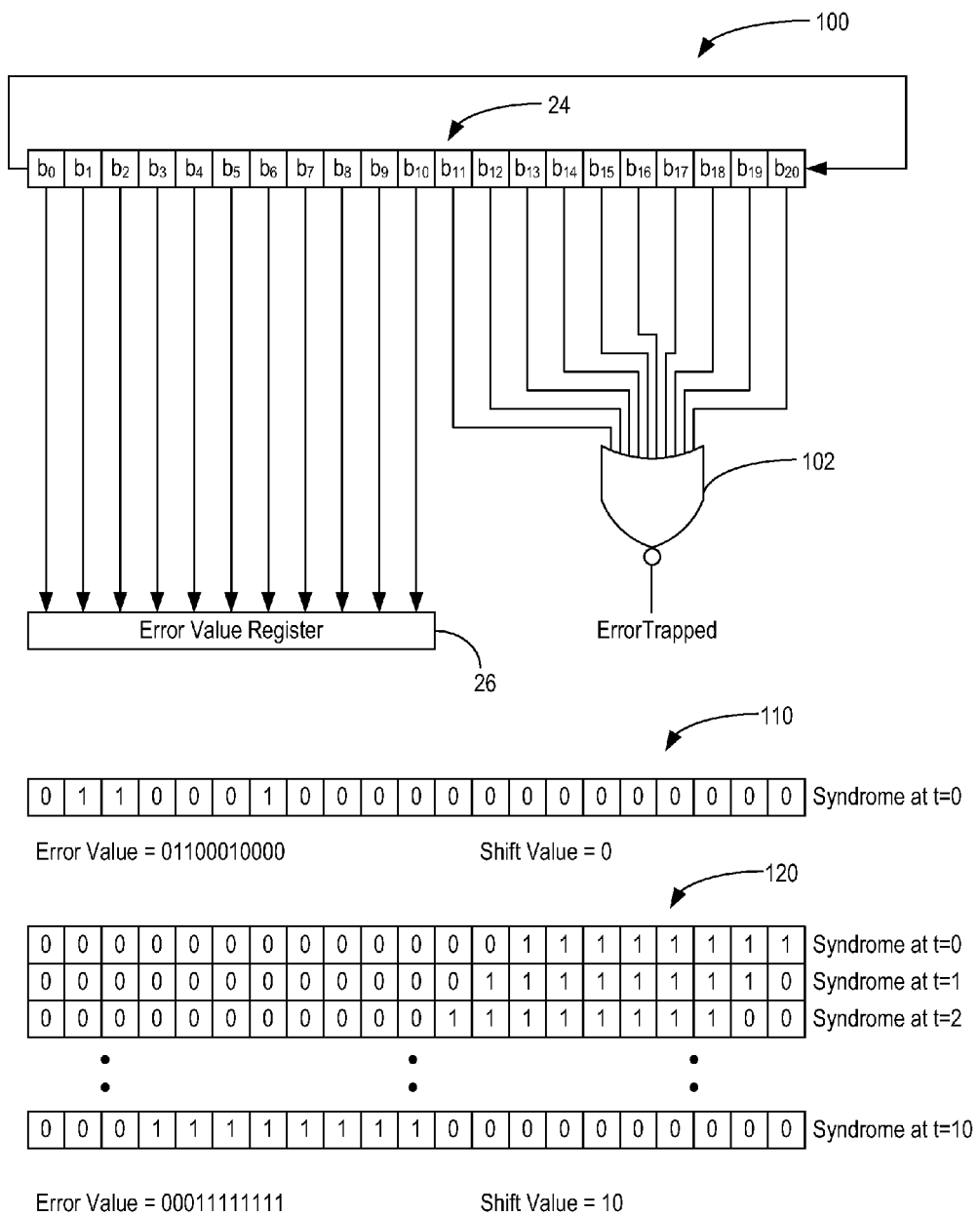
FIG. 2 is a block diagram of error trapping with the 21-bit shift register and the error value register of FIG. 1 according to an exemplary embodiment of the present invention.

The multiplication by the normalization multiplier $\alpha^1$ 38 is done by shifting the values in the normalized syndrome register 34 by one and for bit $b_2$, XOR'ing the value of the current bit $b_1$ in the normalized syndrome register 34 with the current bit $b_{10}$. If $x_{p-1}[n]$ is the current value of the nth bit in the normalized syndrome register 34, and $x_p[n]$ is the updated value of the nth bit in the normalized syndrome register 34 following multiplication by the normalization multiplier $\alpha^1$ 38, then the bits are calculated as follows:

$x_p[0]=x_{p-1}[10]$;

$x_p[1]=x_{p-1}[0]$;

$x_p[2]=x_{p-1}[1]$ XOR $x_{p-1}[10]$;

$x_p[3]=x_{p-1}[2]$;

$x_p[4]=x_{p-1}[3]$;

$x_p[5]=x_{p-1}[4]$;

$x_p[6]=x_{p-1}[5]$;

$x_p[7]=x_{p-1}[6]$;

$x_p[8]=x_{p-1}[7]$;

$x_p[9]=x_{p-1}[8]$;

$x_p[10]=x_{p-1}[9]$;

The multiplication by the normalization multiplier $\alpha^{21}$ 44 is done by performing various XOR functions with existing values in the error location register 40 to provide updated values. If $z_{p-1}[n]$ is the current value of the nth bit in the error location register 40, and $z_p[n]$ is the updated value of the nth bit in the error location register 40 following multiplication by the normalization multiplier $\alpha^{21}$ 44, then the bits are calculated as follows:

$z_p[0]=z_{p-1}[1]$ XOR $z_{p-1}[8]$;

$z_p[1]=z_{p-1}[0]$ XOR $z_{p-1}[2]$ XOR $z_{p-1}[9]$;

$z_p[2]=z_{p-1}[3]$ XOR $z_{p-1}[8]$ XOR $z_{p-1}[10]$;

$z_p[3]=z_{p-1}[0]$ XOR $z_{p-1}[4]$ XOR $z_{p-1}[9]$;

$z_p[4]=z_{p-1}[1]$ XOR $z_{p-1}[5]$ XOR $z_{p-1}[10]$;

$z_p[5]=z_{p-1}[2]$ XOR $z_{p-1}[6]$;

$z_p[6]=z_{p-1}[3]$ XOR $z_{p-1}[7]$;

$z_p[7]=z_{p-1}[4]$ XOR $z_{p-1}[8]$;

$z_p[8]=z_{p-1}[5]$ XOR $z_{p-1}[9]$;

$z_p[9]=z_{p-1}[6]$ XOR $z_{p-1}[10]$;

$z_p[10]=z_{p-1}[0]$ XOR $z_{p-1}[7]$;

The multiplication by the normalization multiplier $\alpha^{1973}$ 32 is done by performing various XOR functions with existing values in the syndrome $S_m$ register 22 to provide updated values. If $y_{p-1}[n]$ is the current value of the nth bit in the syndrome $S_m$ register 22, and $y_p[n]$ is the updated value of the nth bit in the normalized syndrome register 34 following multiplication by the normalization multiplier $\alpha^{1973}$ 32 (note, the result of the multiplication by the normalization multiplier $\alpha^{1973}$ 32 is loaded into the normalized syndrome register 34 through the 2-to-1 multiplexer 36), then the bits are calculated as follows:

$y_p[0]=y_{p-1}[0]$ XOR $y_{p-1}[1]$ XOR $y_{p-1}[7]$ XOR $y_{p-1}[8]$ XOR $y_{p-1}[9]$ XOR $y_{p-1}[10]$;

$y_p[1]=y_{p-1}[1]$ XOR $y_{p-1}[2]$ XOR $y_{p-1}[8]$ XOR $y_{p-1}[9]$ XOR $y_{p-1}[10]$;

$y_p[2]=y_{p-1}[0]$ XOR $y_{p-1}[1]$ XOR $y_{p-1}[2]$ XOR $y_{p-1}[3]$ XOR $y_{p-1}[7]$ XOR $y_{p-1}[8]$;

$y_p[3]=y_{p-1}[0]$ XOR $y_{p-1}[1]$ XOR $y_{p-1}[2]$ XOR $y_{p-1}[3]$ XOR $y_{p-1}[4]$ XOR $y_{p-1}[8]$ XOR $y_{p-1}[9]$;

$y_p[4]=y_{p-1}[0]$ XOR $y_{p-1}[1]$ XOR $y_{p-1}[2]$ XOR $y_{p-1}[3]$ XOR $y_{p-1}[4]$ XOR $y_{p-1}[5]$ XOR $y_{p-1}[9]$ XOR $y_{p-1}[10]$;

$y_p[5]=y_{p-1}[1]$ XOR $y_{p-1}[2]$ XOR $y_{p-1}[3]$ XOR $y_{p-1}[4]$ XOR $y_{p-1}[5]$ XOR $y_{p-1}[6]$ XOR $y_{p-1}[10]$;

$y_p[6]=y_{p-1}[2]$ XOR $y_{p-1}[3]$ XOR $y_{p-1}[4]$ XOR $y_{p-1}[5]$ XOR $y_{p-1}[6]$ XOR $y_{p-1}[7]$;

$y_p[7]=y_{p-1}[3]$ XOR $y_{p-1}[4]$ XOR $y_{p-1}[5]$ XOR $y_{p-1}[6]$ XOR $y_{p-1}[7]$ XOR $y_{p-1}[8]$;

$y_p[8]=y_{p-1}[4]$ XOR $y_{p-1}[5]$ XOR $y_{p-1}[6]$ XOR $y_{p-1}[7]$ XOR $y_{p-1}[8]$ XOR $y_{p-1}[9]$;

$y_p[9]=y_{p-1}[5]$ XOR $y_{p-1}[6]$ XOR $y_{p-1}[7]$ XOR $y_{p-1}[8]$ XOR $y_{p-1}[9]$ XOR $y_{p-1}[10]$;

$y_p[10]=y_{p-1}[0]$ XOR $y_{p-1}[6]$ XOR $y_{p-1}[7]$ XOR $y_{p-1}[8]$ XOR $y_{p-1}[9]$ XOR $y_{p-1}[10]$;

Referring to FIG. 2, error trapping 100 is illustrated with the 21-bit shift register 24 and the error value register 26 according to an exemplary embodiment of the present invention. The 21-bit shift register 24 is loaded with data, $b_0 \ldots b_{20}$. The error trapping 100 performs a shift of the data, $b_0 \ldots b_{20}$, until all data between $b_{11}$ and $b_{20}$ are equal to zero, i.e. an XOR 102 of $b_{11}$ through $b_{20}$ equals 1. The shift moves $b_0$ to $b_{20}$, $b_1$ to $b_0$, $b_2$ to $b_1$, etc. Once the error is trapped, i.e. XOR 102 equals 1, the values $b_0$ through $b_{10}$ provide the error value, and these are loaded into the error value register 26. This process keeps track of the number of shifts as this is used to normalize $S_m$. An example operation 110 shows an Error Value=01100010000 when the error is trapped. No shifts are required in the operation 110. An example operation 120 shows an Error Value=00011111111 when the error is trapped after 10 shifts of the shift register.

Figure 3:
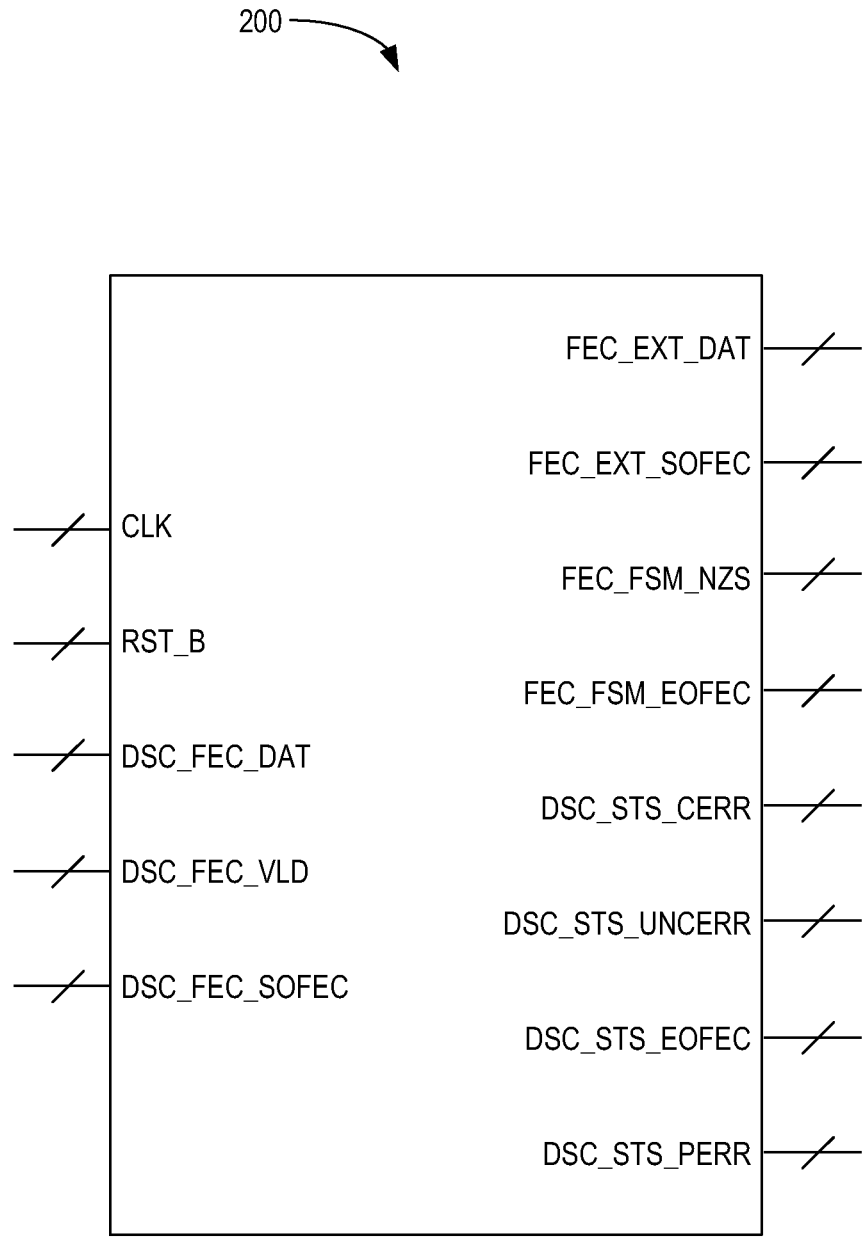
FIG. 3 is a block diagram of inputs and outputs for a FEC decoder configured to decode a (2112, 2080) burst error correction code according to an exemplary embodiment of the present invention.

Referring to FIG. 3, a block diagram illustrates inputs and outputs for a FEC decoder 200 configured to decode a (2112, 2080) burst error correction code according to an exemplary embodiment of the present invention. The FEC decoder 200 is configured to receive a 21-bit data and a clock enable from a PN-2112 descrambler and to send decoded 21-bit corrected data to a data extraction block. The input/output ports for the FEC decoder 200 include:

| Signal Name | Type | Bit Width | Description |
| --- | --- | --- | --- |
| CLK | in | 1 | 375 MHz Core Clock |
| RST_B | in | 1 | Asynchronous low-asserted reset signal. |
| DSC_FEC_DAT | in | 21 | 21-bit data received from the PN-2112 descrambler. |
| DSC_FEC_VLD | in | 1 | The data valid signal will be asserted when new data is available. |
| DSC_FEC_SOFEC | in | 1 | Start of Codeword is asserted for the first 21-bit word of the FEC block |
| FEC_EXT_DAT | out | 21 | 21-bit corrected codeword |
| FEC_EXT_VLD | out | 1 | Output data valid signal |
| FEC_EXT_SOFEC | out | 1 | Output Start of Codeword is asserted on the first word of the FEC block |
| FEC_FSM_NZS | out | 1 | FEC block non-zero syndrome received |
| FEC_FSM_EOFEC | out | 1 | Asserted when the last word of the FEC block has been processed by the syndrome computation block and the non-zero syndrome status is valid |
| DSC_STS_CERR | out | 1 | FEC block correctable error |
| DSC_STS_UNCERR | out | 1 | FEC block uncorrectable error |
| DSC_STS_EOFEC | out | 1 | End of FEC block is asserted when the last word has been processed and the FEC block status bits are valid |
| DSC_STS_PERR | out | 1 | Indicates a Delay RAM parity error has been detected |

The FEC decoder is pipelined to simultaneously perform three different functions: Syndrome Computation, Error Trapping and Syndrome Normalization, and Error Correction. Data is stored in a Delay random access memory (RAM) while the Syndrome Computation and Error Trapping functions are processing the FEC block. The Syndrome Computation does not complete until all bits of the codeword have been processed, i.e. 101 values for a 2112 code word (zero-padded to 2121-bits). The Error Trapping and Syndrome Normalization function takes 20 cycles. Therefore, the Delay RAM supports delaying the 21-bit values by 121 cycles. The Error Correction block processes the FEC block while the 21-bit values are coming out of the delay RAM and adds no additional delay to the data. The Error Correction function is not complete until the last codeword is read from the Delay RAM.

The data valid signal, dsc_fec_vld, is valid for approximately 5 out of 6 clock cycles due to the clock domain crossing from the 312.5 MHz clock domain to the 375 MHz clock domain. The 20-to-21 bit conversion reduces the word rate further.

The Syndrome Computation circuit requires 101 clock cycles with dsc_fec_vld asserted to compute the syndrome values, $S_p$ and $S_m$ 14,16. On the first clock cycle of the next FEC block, the syndrome values $S_p$ and $S_m$ are transferred to the 21-bit Shift Register 24 and the Normalized Syndrome register 34, respectively. At the same time, the two syndrome values are checked for zero. If either of the syndrome values are non-zero, the Fire Code decoder 200 reports the non-zero syndrome to the controller.

Once the 21-bit Shift Register 24 and Normalized Syndrome registers 34 have been loaded, the Error Trapping and Syndrome Normalization functions require up to 20 clock cycles to complete. When any of the lower 10-bits of the shift register 24 are non-zero, the shift register 24 circularly rotates the data and the normalized syndrome 34 value is multiplied by $\alpha^1$ 38. When the lower 10-bits of the shift register 24 are all zeros, the error is trapped and the syndrome value is prepared for the next stage. This function finds the error value and adjusts the syndrome value for the bit position of the error. When this function completes, values are loaded into the Shift Value Register 30, Error Value Register 26, and Error Location Register 40.

As each 21-bit value is read from the Delay RAM, the Error Correction block compares the value in the Error Location Register 40 with the Error Value Register 26. If there is a match, the error is found and the error is corrected by XOR'ing the bit-shifted error value with the 21-bit data. Otherwise, the value in the Error Location Register 40 is multiplied by $\alpha^{21}$ 44 in preparation for the next word check. This is repeated until the end of the FEC block.

The FEC decoder 200 can be any custom made or commercially available application specific integrated circuit (ASIC), field programmable gate array (FPGA), processor, a semiconductor-based microprocessor (in the form of a microchip or chip set), or generally any device for executing software instructions. As described herein, the FEC decoder 200 requires significantly fewer gates than existing implementations. Accordingly, the FEC decoder 200 can be integrated in any device utilizing burst error correction codes to provide reduced power consumption, space, and cost.

The present invention can apply to any burst error correction code with the generator polynomial in the form $g(X)=(X^{21-n}+1)p(X)$ and which meets the requirements described herein. The processing bit width is (21-n) bits (or an integer multiple of 21-n) and all of the Galois field arithmetic is performed in $GF(2^m)$, where m is the order of the primitive polynomial p(X). Note the algorithm can be further parallelized by doubling the processing width and that non-integer multiples of the processing width are possible, although adding complexity.

In the present invention, part of the efficiency is recognizing that the number of shifts to trap the error defines the error starting location within a word. Using a constant-coefficient multiplier to multiply by $\alpha^1$ with every shift of the shift register aligns the syndrome, normalized by multiplying by $\alpha^{1973}$, to the starting bit location of the error burst within the word. And then finally, multiplying by $\alpha^{21}$, allows the FEC decoder to check the next possible location. Constant Coefficient Multipliers in Galois Fields are much more efficient normal $GF(2^m)$ multipliers.

Although the present invention has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present invention and are intended to be covered by the following claims.

What is claimed is:

1. A system for the efficient parallel implementation of a burst error correction code, comprising:
    error trapping circuitry calculating a first syndrome of a Fire Code and configured to find an error pattern and a starting location of an error burst within a data word of a plurality of data words comprising a full code word;
    error location circuitry calculating a second syndrome of the Fire Code and configured to find the data word of the plurality of data words that holds the starting location of the error burst, wherein the error location circuitry comprises circuitry configured to perform Galois Field arithmetic to align a starting location of the error burst based on the error trapping circuitry; and error correction circuitry configured to correct the error burst;

wherein the error trapping circuitry and first syndrome are implemented parallel to the error location circuitry and the second syndrome;

wherein Syndrome Computation, Error Trapping and Syndrome Normalization, and Error Correction are performed simultaneously using the parallel implementation;

wherein an input data stream is received simultaneously at the error trapping circuitry, the error location circuitry, and a first-in-first-out block; and wherein, as an output of the first-in-first-out block is being read, an output of the error trapping circuitry is compared to an output of the error location circuitry, and:

if the output of the error trapping circuitry and the error location circuitry are equal, then an error location has been found and the output of the error trapping circuitry is shifted; and if the output of the error trapping circuitry and the error location circuitry are not equal, then the output of the error location circuitry is multiplied by a normalization multiplier.

2. The system of claim 1, wherein the error trapping circuitry comprises circuitry configured to calculate the first syndrome over each of the plurality of data words, wherein the first syndrome is utilized to trap the error pattern; and wherein the error location circuitry comprises circuitry configured to calculate the second syndrome over each of the plurality of data words, wherein the second syndrome is utilized to determine which of the plurality of data words comprise a beginning of the error pattern, and wherein the circuitry configured to perform Galois Field arithmetic operates on the second syndrome.

3. The system of claim 2, wherein the error trapping circuitry further comprises a shift register configured to shift until the error burst is trapped; and wherein the circuitry configured to perform Galois Field arithmetic is further configured to align the second syndrome responsive to the number of shifts of the shift register.

4. The system of claim 3, further comprising:

comparison circuitry to check the second syndrome after the Galois Field arithmetic with the error burst; and second circuitry configured to perform Galois Field arithmetic to align the second syndrome to a another data word of the plurality of data words if the comparison circuitry is not equal;

wherein the error correction circuitry configured to correct the error burst if the comparison circuitry is equal.

5. The system of claim 4, wherein if the comparison circuitry is not equal, a current data word of the plurality of data words does not contain the error pattern, and wherein the current data word is output for processing.

6. The system of claim 4, wherein the error correction circuitry comprises an exclusive OR.

7. The system of claim 2, wherein the burst error correction code comprises a generator polynomial in a form $g(X)=(X^{21-n}+1)p(X)$ and all of the Galois field arithmetic is performed in $GF(2^m)$, where m is the order of the primitive polynomial p(X) and n is a positive integer such that n <=m and 21-n is not divisible by a period of p(X).

8. The system of claim 7, wherein the burst error correction code comprises a (2112, 2080) burst error correction code and the generator polynomial is in a form $g(X)=(X^{21}+1)(X^{11}+X^{2}+1)$ and all of the Galois field arithmetic is performed in $GF(2^{11})$.

9. The system of claim 8, wherein the error trapping circuitry, the error location circuitry, and the error correction circuitry are pipelined to simultaneously perform Syndrome Computation, Error Trapping and Syndrome Normalization, and Error Correction.

10. The system of claim 9, further comprising a Delay random access memory configured to store the plurality of data words while the Syndrome Computation and Error Trapping functions are processing in the error trapping circuitry and the error location circuitry.

11. The system of claim 10, wherein the Syndrome Computation requires 101 cycles for the (2112, 2080) burst error correction code;

wherein the Error Trapping and Syndrome Normalization function requires 20 cycles for the (2112, 2080) burst error correction code; and wherein the error correction circuitry processes values coming out of the Delay random access memory without requiring additional cycles.

12. The system of claim 8, wherein the system is compliant to IEEE 802.3ap.

13. A method for the efficient parallel implementation of a burst error correction code, comprising:

partitioning a received block of data into a plurality of data words;

calculating a first syndrome of a Fire Code and a second syndrome of the Fire Code using each of the plurality of data words;

trapping an error burst utilizing the first syndrome;

determining which of the plurality of data words contains the error burst based on the second syndrome;

aligning the second syndrome with Galois Field arithmetic; and checking the trapped error burst with the aligned second syndrome;

wherein the first syndrome is implemented parallel to the second syndrome;

wherein Syndrome Computation, Error Trapping and Syndrome Normalization, and Error Correction are performed simultaneously using the parallel implementation;

wherein an input data stream is received simultaneously at error trapping circuitry, error location circuitry, and a first-in-first-out block; and wherein, as an output of the first-in-first-out block is being read, an output of the error trapping circuitry is compared to an output of the error location circuitry, and:

if the output of the error trapping circuitry and the error location circuitry are equal, then an error location has been found and the output of the error trapping circuitry is shifted; and if the output of the error trapping circuitry and the error location circuitry are not equal, then the output of the error location circuitry is multiplied by a normalization multiplier.

14. The method of claim 13, further comprising:

if the checking step determines the trapped error burst equals the aligned second syndrome, correcting the error burst utilizing the trapped error burst and the aligned second syndrome; and if the checking step determines the trapped error burst does not equals the aligned second syndrome, aligning the second syndrome with Galois Field arithmetic to a next data word of the plurality of data words and providing a current data word for processing.

15. The method of claim 13, wherein the burst error correction code comprises a generator polynomial in a form $g(X)=(X^{21-n}+1)p(X)$ and all of the Galois field arithmetic is performed in $GF(2^m)$, where m is the order of the primitive polynomial $p(X)$ and n is a positive integer such that $n<=m$ and 21-n is not divisible by a period of $p(X)$.

16. The method of claim 15, wherein the burst error correction code comprises a (2112, 2080) burst error correction code and the generator polynomial is in a form $g(X)=(X^{21}+1)(X^{11}+X^2+1)$ and all of the Galois field arithmetic is performed in $GF(2^{11})$.

17. The method of claim 16, wherein the method is utilized in a device compliant to IEEE 802.3ap.

18. A system for the efficient parallel implementation of a burst error correction code, comprising:
   error trapping circuitry calculating a first syndrome and configured to find an error pattern and a starting location of an error burst within a data word of a plurality of data words comprising a full code word;
   error location circuitry calculating a second syndrome and configured to find the data word of the plurality of data words that holds the starting location of the error burst, wherein the error location circuitry comprises circuitry configured to perform Galois Field arithmetic to align a starting location of the error burst based on the error trapping circuitry; and
   error correction circuitry configured to correct the error burst;
   wherein the error trapping circuitry and first syndrome are implemented parallel to the error location circuitry and the second syndrome;
   wherein Syndrome Computation, Error Trapping and Syndrome Normalization, and Error Correction are performed simultaneously using the parallel implementation; and
   wherein the system is utilized with one of a double processing width and a non-integer processing width.

* * * * *